(12) United States Patent
Lee

(10) Patent No.: US 12,002,517 B2
(45) Date of Patent: Jun. 4, 2024

(54) SEMICONDUCTOR MEMORY DEVICE

(71) Applicant: SK hynix Inc., Icheon-si (KR)

(72) Inventor: Hee Youl Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 248 days.

(21) Appl. No.: 17/534,210

(22) Filed: Nov. 23, 2021

(65) Prior Publication Data
US 2023/0005549 A1 Jan. 5, 2023

(30) Foreign Application Priority Data

Jul. 1, 2021 (KR) .......................... 10-2021-0086593

(51) Int. Cl.
*G11C 16/24* (2006.01)
*G11C 16/10* (2006.01)
*G11C 16/14* (2006.01)

(52) U.S. Cl.
CPC .............. *G11C 16/24* (2013.01); *G11C 16/10* (2013.01); *G11C 16/14* (2013.01)

(58) Field of Classification Search
CPC ......... G11C 16/24; G11C 16/10; G11C 16/14; G11C 16/08; G11C 16/26; G11C 16/16; G11C 16/0483; G11C 16/3427; G11C 16/30

USPC ................................................. 365/185, 180
See application file for complete search history.

(56) References Cited

U.S. PATENT DOCUMENTS

2011/0273944 A1* 11/2011 Park ..................... G11C 7/1087
365/189.16
2019/0371408 A1* 12/2019 Yu .......................... G11C 16/24

FOREIGN PATENT DOCUMENTS

| CN | 112951297 | * | 7/2020 | ........... G11C 7/1084 |
| KR | 102148569 B1 | | 8/2020 | |
| KR | 1020210096490 A | | 8/2021 | |

* cited by examiner

*Primary Examiner* — Hoai V Ho
(74) *Attorney, Agent, or Firm* — WILLIAM PARK & ASSOCIATES LTD.

(57) ABSTRACT

A semiconductor memory device includes a memory cell array, a page buffer, and control logic. The memory cell array includes a plurality of memory cells for storing data. The page buffer is coupled to at least one memory cell among the plurality of memory cells through a bit line and is configured to store data in the at least one memory cell. The control logic is configured to control an operation of the page buffer. The page buffer includes a first transistor coupled between the bit line and a first node, a second transistor coupled between the bit line and an external power voltage terminal, and an internal operation circuit coupled to the first node.

14 Claims, 11 Drawing Sheets

SEMICONDUCTOR MEMORY DEVICE

CROSS-REFERENCE TO RELATED APPLICATION

The present application claims priority under 35 U.S.C. § 119(a) to Korean patent application number 10-2021-0086593, filed on Jul. 1, 2021, which is incorporated herein by reference in its entirety.

BACKGROUND

1. Technical Field

The present application relates to an electronic device, and more particularly, to a semiconductor memory device.

2. Related Art

A semiconductor memory device may be formed in a two-dimensional structure in which strings are horizontally arranged on a semiconductor substrate, or in a three-dimensional structure in which strings are vertically stacked on the semiconductor substrate. A three-dimensional memory device is a memory device designed to overcome a limit of integration degree of a two-dimensional memory device, and may include a plurality of memory cells that are vertically stacked on a semiconductor substrate.

SUMMARY

An embodiment of the present disclosure provides a semiconductor memory device capable of preventing or delaying a junction breakdown of a transistor in a page buffer during an erase operation.

Another embodiment of the present disclosure provides a semiconductor memory device capable of preventing or mitigating a leakage current in a page buffer during a program operation.

According to an embodiment of the present disclosure, a semiconductor memory device includes a memory cell array, a page buffer, and control logic. The memory cell array includes a plurality of memory cells for storing data. The page buffer is coupled to at least one memory cell among the plurality of memory cells through a bit line and is configured to store data in the at least one memory cell. The control logic controls an operation of the page buffer. The page buffer includes a first transistor coupled between the bit line and a first node, a second transistor coupled between the bit line and an external power voltage terminal, and an internal operation circuit coupled to the first node. When a program inhibit bias is transmitted to the bit line, the control logic controls the page buffer to transmit the program inhibit bias from the internal operation circuit to the bit line by turning on the first transistor and disconnect between the external power voltage terminal and the bit line by turning off the second transistor. A first voltage greater than 0V is applied to the external power voltage terminal while the program inhibit bias is transmitted to the bit line.

In an embodiment, the page buffer may further include a third transistor coupled between the first node and ground. The control logic may control the page buffer to disconnect between the first node and the ground by turning off the third transistor while the program inhibit bias is transmitted to the bit line.

In an embodiment, the internal operation circuit may receive a power voltage from an internal power voltage terminal, and output a second voltage supplied by the internal power voltage terminal to the first node as the program inhibit bias.

In an embodiment, the internal operation circuit may receive a power voltage from an internal power voltage terminal, and output a third voltage generated based on a second voltage supplied from the internal power voltage terminal to the first node as the program inhibit bias.

In an embodiment, the first voltage may be a voltage between 0.5V to 1V.

In an embodiment, the first transistor may be a high-voltage protection transistor.

In an embodiment, the internal operation circuit may include a fourth transistor coupled between the first node and a second node, a fifth transistor coupled between the internal power voltage and a third node, a sixth transistor coupled between the second node and the third node, a seventh transistor coupled between the third node and a fourth node, and an eighth transistor coupled between the second node and the fourth node.

According to another embodiment of the present disclosure, a semiconductor memory device includes a memory cell array, a page buffer, and control logic. The memory cell array includes a plurality of memory cells for storing data. The page buffer is coupled to at least one memory cell among the plurality of memory cells through a bit line and is configured to erase data stored in the at least one memory cell. The control logic controls an operation of the page buffer. The page buffer includes a first transistor coupled between the bit line and a first node, a second transistor coupled between the first node and a ground, a third transistor coupled between the bit line and an external power voltage terminal, and an internal operation circuit coupled to the first node. When an erase bias is applied to the bit line, an erase voltage is applied to the external power voltage terminal. In addition, the control logic controls the page buffer to connect the external power voltage terminal and the bit line by turning on the third transistor and apply a first voltage greater than 0V and less than a turn-on voltage to a gate of the first transistor.

In an embodiment, the control logic may control the page buffer to apply a turn-on voltage greater than the erase voltage to a gate of the third transistor.

In an embodiment, the first voltage may be between 1V and 2V.

In an embodiment, the first transistor may be a high-voltage protection transistor.

In an embodiment, while an erase bias is transmitted to the bit line, the control logic may control the page buffer to disconnect between the first node and the ground by turning off the second transistor.

In an embodiment, the internal operation circuit may include a fourth transistor coupled between the first node and a second node, a fifth transistor coupled between the internal power voltage and a third node, a sixth transistor coupled between the second node and the third node, a seventh transistor coupled between the third node and a fourth node, and an eighth transistor coupled between the second node and the fourth node.

In an embodiment, the control logic may control the page buffer to disconnect between the first node and the second node by turning off the fourth transistor while an erase bias is transmitted to the bit line.

The present technology may provide a semiconductor memory device capable of preventing or delaying a junction breakdown of a transistor in a page buffer during an erase operation.

In addition, the present technology may provide a semiconductor memory device capable of preventing or mitigating a leakage current in a page buffer during a program operation.

DETAILED DESCRIPTION

Specific structural or functional descriptions in the present specification or application are provided to describe presented embodiments in accordance with the concept of the present disclosure. The embodiments may be carried out in various forms and should not be construed as being an exhaustive representation of the present teachings.

Figure 1:
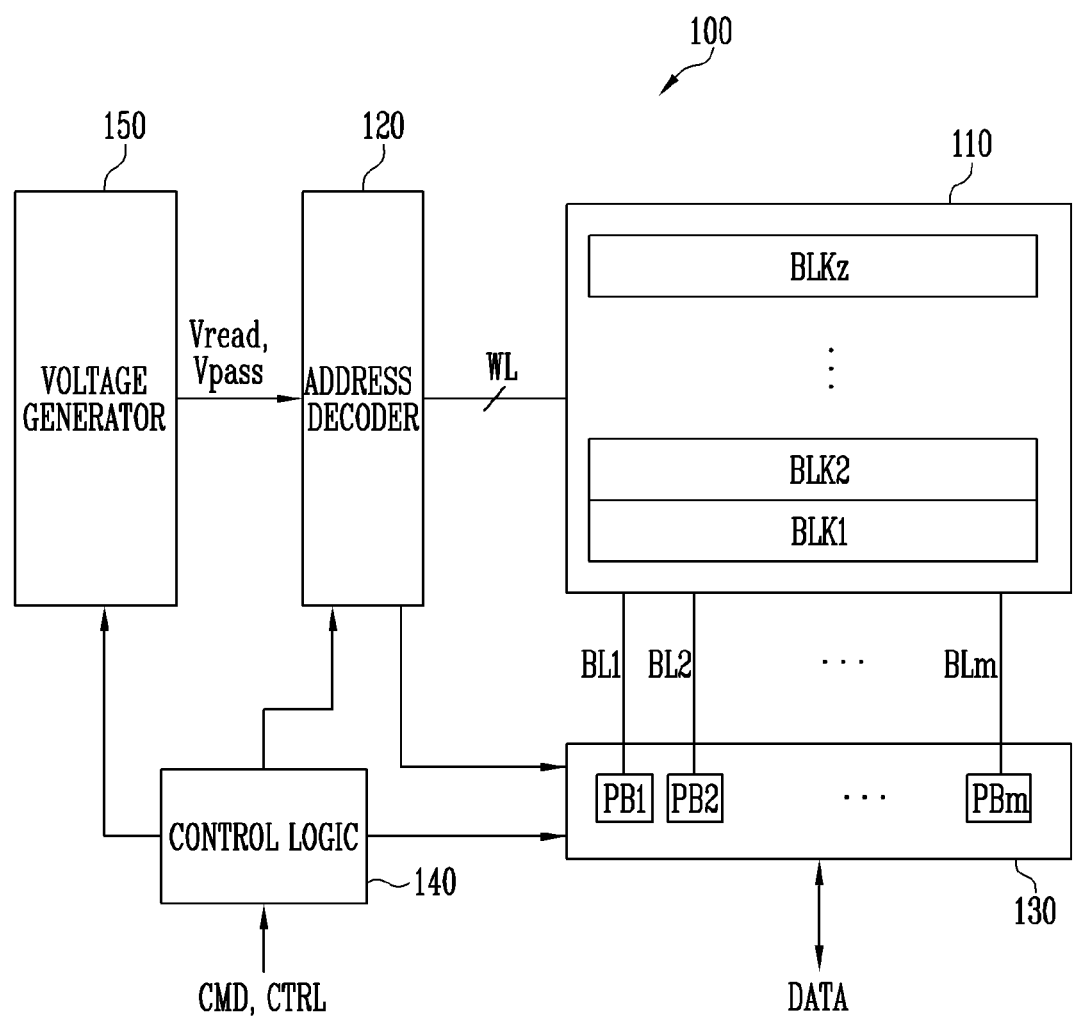
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 100 includes a memory cell array 110, an address decoder 120, a read and write circuit 130, control logic 140, and a voltage generator 150.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. In an embodiment, the plurality of memory cells are non-volatile memory cells, and may be configured with non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Meanwhile, each of the plurality of memory cells included in the memory cell array may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, each of the plurality of memory cells included in the memory cell array 110 may be a triple-level cell storing three bits of data. In still another embodiment, each of the plurality of memory cells included in the memory cell array 110 may be a quad-level cell storing four bits of data. According to an embodiment, the memory cell array 110 may include a plurality of memory cells each storing five or more bits of data.

The address decoder 120, the read and write circuit 130, and the voltage generator 150 operate as a peripheral circuit which drives the memory cell array 110. At this time, the peripheral circuit is operated under the control of the control logic 140. The address decoder 120 is connected to the memory cell array 110 through the word lines WL. The address decoder 120 is configured to operate in response to the control of the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated in the voltage generator 150 to a selected word line of the selected memory block at a time of a read voltage application operation during a read operation, and applies a pass voltage Vpass to the remaining unselected word lines. In addition, during a program verify operation, the address decoder 120 applies a verify voltage generated in the voltage generator 150 to the selected word line of the selected memory block, and applies the pass voltage Vpass to the remaining unselected word lines.

The address decoder 120 is configured to decode a column address of the received addresses. The address decoder 120 transmits the decoded column address to the read and write circuit 130.

A read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm sense a change of an amount of a current flowing according to a program state of a corresponding memory cell through a sensing node while continuously supplying a sensing current to the bit lines connected to the memory cells, and latches the sensed change as sensing data. The read and write circuit 130 operates in response to page buffer control signals output from the control logic 140.

During the read operation, the read and write circuit 130 senses data of the memory cell, temporarily stores read data, and outputs data DATA to the input/output buffer (not shown) of the semiconductor memory device 100. In an embodiment, the read and write circuit 130 may include a column selection circuit, and the like, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. In addition, the control logic 140 outputs a control signal for adjusting a sensing node precharge potential level of the plurality of page buffers PB1 to PBm. The control logic 140 may control the read and write circuit 130 to perform the read operation of the memory cell array 110. The control logic controls the voltage generator 150 to generate various voltages used during the program operation of the memory cell array 110. In addition, the control logic 140 controls the address decoder 120 to transfer the voltages generated by the voltage generator 150 to local lines of a memory block which is an operation target through global lines. Meanwhile, the control logic 140 controls the read and write circuit 130 to read data of a selected page of the memory block through the bit lines BL1 to BLm during the read operation and store the data in the page buffers PB1 to PBm. In addition, the control logic 140 controls the read and write circuit 130 to program the data, which is stored in the page buffers PB1 to PBm, in the selected page during the program operation. The control logic 140 may be implemented as hardware, software, or a combination of hardware and software. For example, the control logic 140 may be a control logic circuit operating in accordance with an algorithm and/or a processor executing control logic code.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140.

The address decoder 120, the read and write circuit 130, and the voltage generator 150 may function as a "peripheral circuit" that performs a read operation, a write operation, and an erase operation on the memory cell array 110. The peripheral circuit performs the read operation, the write operation, and the erase operation on the memory cell array 110 based on the control of the control logic 140.

Figure 2:
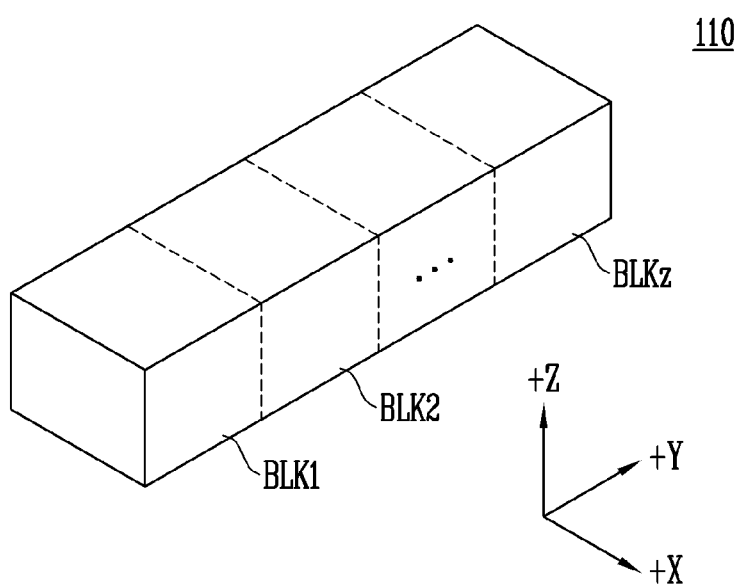
FIG. 2 is a block diagram illustrating an embodiment of a memory cell array of FIG. 1.

FIG. 2 is a block diagram illustrating an embodiment of the memory cell array 110 of FIG. 1.

Referring to FIG. 2, the memory cell array 110 includes a plurality of memory blocks BLK1 to BLKz. Each memory block has a three-dimensional structure. Each memory block includes a plurality of memory cells stacked on a substrate. The plurality of memory cells are arranged along a +X direction, a +Y direction, and a +Z direction. A structure of each memory block is described in more detail with reference to FIGS. 3 and 4.

Figure 3:
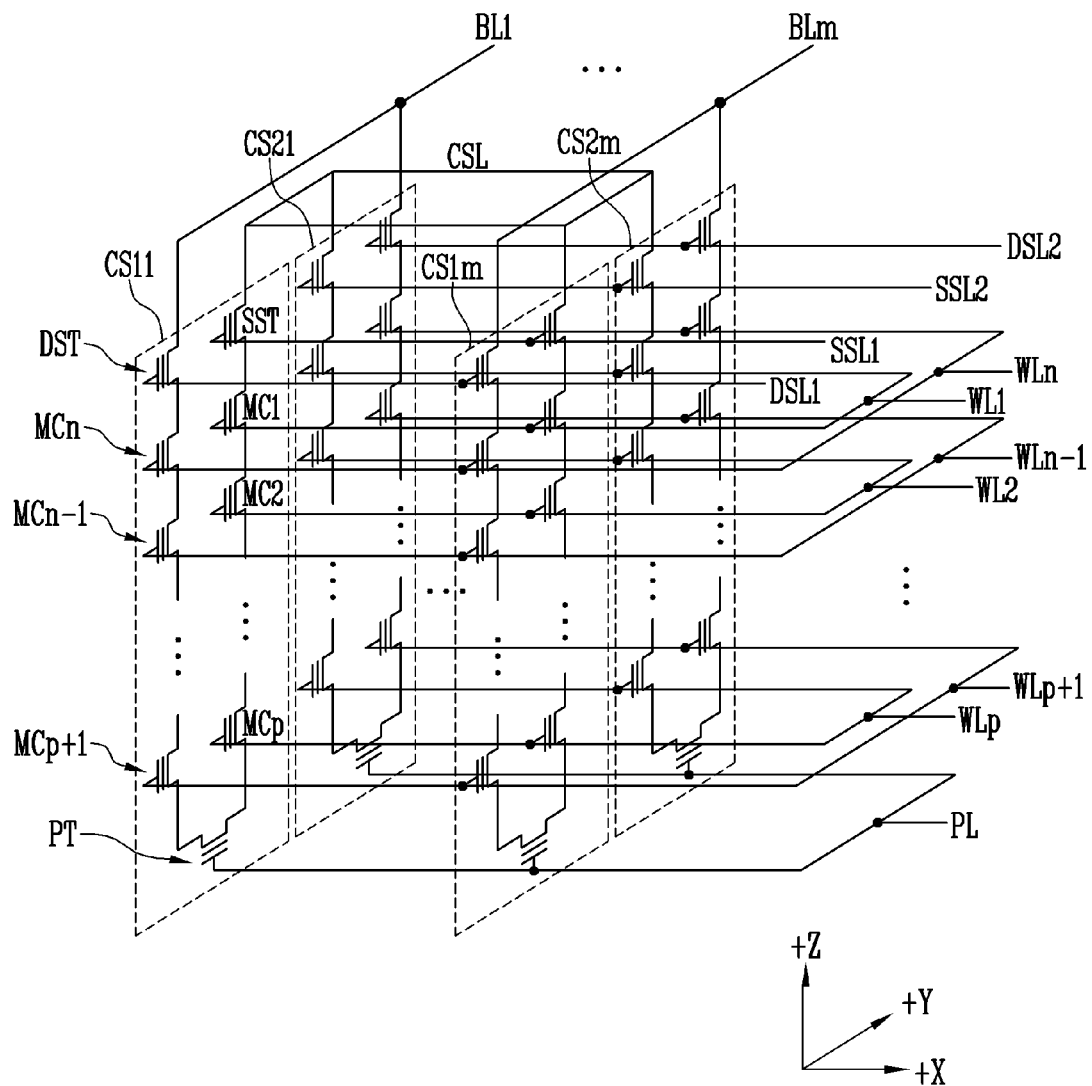
FIG. 3 is a circuit diagram illustrating any one memory block among the memory blocks of FIG. 2.

FIG. 3 is a circuit diagram illustrating any one memory block BLKa of the memory blocks BLK1 to BLKz of FIG. 2.

Referring to FIG. 3, the memory block BLKa includes a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (that is, the +X direction). In FIG. 3, two cell strings are arranged in a column direction (that is, the +Y direction). However, this is for convenience of description and it is understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

In an embodiment, the source select transistors of the cell strings arranged in the same row are connected to a source select line extending in the row direction, and the source select transistors of the cell strings arranged in different rows are connected to different source select lines. In FIG. 3, the source select transistors of the cell strings CS11 to CS1m of a first row are connected to a first source select line SSL1. The source select transistors of the cell strings CS21 to CS2m of a second row are connected to a second source select line SSL2.

In another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The drain select transistors DST of cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 3, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1, among the cell strings CS11 to CS1m of the first row configure one page. The memory cells connected to the first word line WL1, among the cell strings CS21 to CS2m of the second row configure another page. The cell strings arranged in one row direction may be selected by selecting any one of the drain select lines DSL1 and DSL2. One page of the selected cell strings may be selected by selecting any one of the word lines WL1 to WLn.

In another embodiment, even bit lines and odd bit lines may be provided instead of the first to m-th bit lines BL1 to BLm. In addition, even-numbered cell strings among the cell strings CS11 to CS1m or CS21 to CS2m arranged in the row direction may be connected to even bit lines, and odd-numbered cell strings among the cell strings CS11 to CS1m or CS21 to CS2m arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less dummy memory cells are provided, the size of the memory block BLKa may be reduced, but the reliability of the operation for the memory block BLKa may be reduced.

In order to efficiently control at least one dummy memory cell, each of the dummy memory cells may have a required threshold voltage. Before or after an erase operation for the memory block BLKa, program operations for all or some of the dummy memory cells may be performed. When the erase operation is performed after the program operation is performed, the dummy memory cells may have the required threshold voltage by controlling a voltage applied to dummy word lines connected to the respective dummy memory cells.

Figure 4:
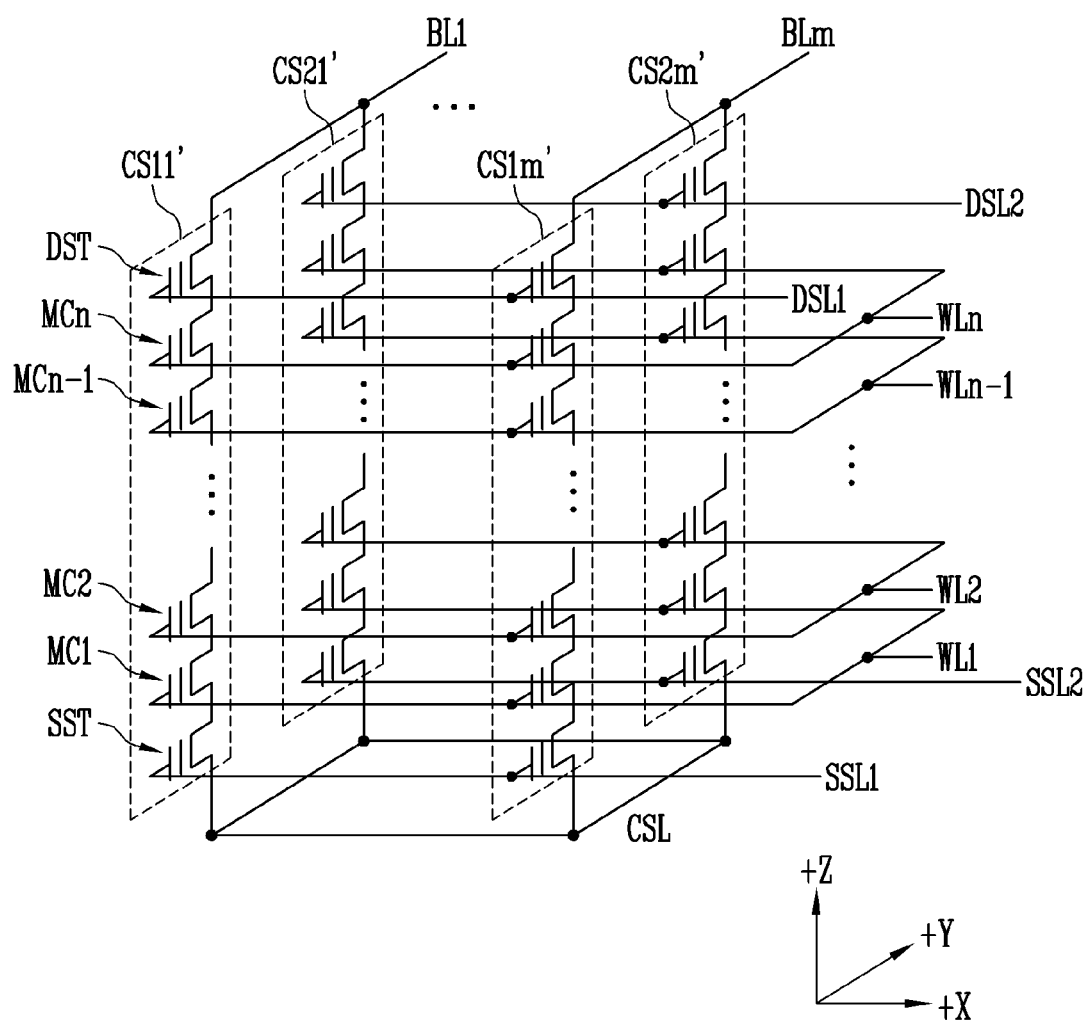
FIG. 4 is a circuit diagram illustrating another embodiment of any one memory block among the memory blocks of FIG. 2.

FIG. 4 is a circuit diagram illustrating another embodiment of any one memory block BLKb of the memory blocks BLK1 to BLKz of FIG. 2.

Referring to FIG. 4, the memory block BLKb includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLKb.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. In another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

The memory block BLKb of FIG. 4 represents a circuit similar to that of the memory block BLKa of FIG. 3 except that the pipe transistor PT is excluded from each cell string.

In another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less dummy memory cells are provided, the size of the memory block BLKb may be reduced, but the reliability of the operation for the memory block BLKb may be reduced.

In order to efficiently control at least one dummy memory cell, each of the dummy memory cells may have a required threshold voltage. Before or after an erase operation for the memory block BLKb, program operations for all or some of the dummy memory cells may be performed. When the erase operation is performed after the program operation is performed, the dummy memory cells may have the required threshold voltage by controlling a voltage applied to the dummy word lines connected to the respective dummy memory cells.

Figure 5:
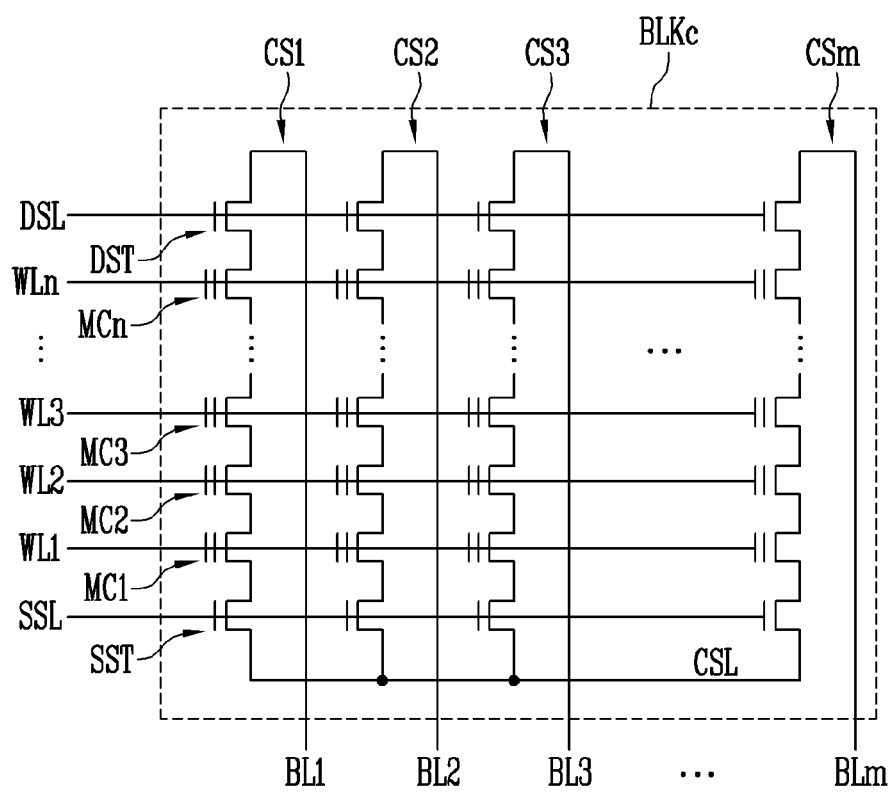
FIG. 5 is a circuit diagram illustrating an embodiment of any one memory block among the memory blocks included in the memory cell array of FIG. 1.

FIG. 5 is a circuit diagram illustrating an embodiment of any one memory block BLKc of the memory blocks BLK1 to BLKz included in the memory cell array 110 of FIG. 1.

Referring to FIG. 5, the memory block BLKc includes a plurality of cell strings CS1 to CSm. The plurality of cell strings CS1 to CSm may be connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting any one of the word lines WL1 to WLn.

In another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

As shown in FIGS. 2 to 4, the memory cell array 110 of the semiconductor memory device 100 may be configured to have a three-dimensional structure. In addition, as shown in FIG. 5, the memory cell array 110 of the semiconductor memory device 100 may be configured to have a two-dimensional structure.

Figure 6:
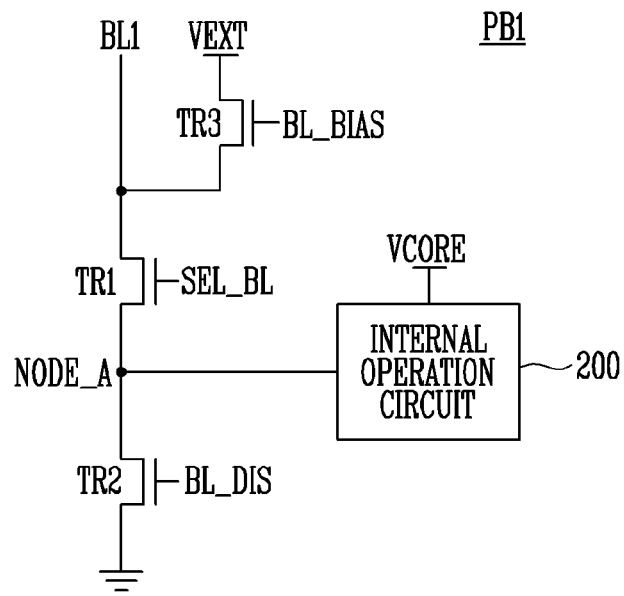
FIG. 6 is a circuit diagram illustrating a page buffer included in the semiconductor memory device of FIG. 1 according to an embodiment of the present disclosure.

FIG. 6 is a circuit diagram illustrating the page buffer PB1 included in the semiconductor memory device 100 according to an embodiment of the present disclosure. The page buffer shown in FIG. 6 may also be representative of the other page buffers PB2 to PBm included in the read and write circuit 130 of FIG. 1. Because the plurality of page buffers PB1 to PBm included in the read and write circuit 130 may be configured similarly to each other, any one of the page buffers is described as an example.

The page buffer PB1 is connected to the memory cell through the bit line BL1. Meanwhile, the page buffer PB1 may include a first transistor TR1 connected between the bit line BL1 and an A node NODE_A, a second transistor TR2 connected between the A node NODE_A and a ground, a third transistor TR3 connected between the bit line BL1 and an external power voltage terminal VEXT, and an internal operation circuit 200 connected to the A node NODE_A. The first transistor TR1 may be controlled by a bit line selection signal SEL_BL and may operate to selectively connect the bit line BL1 and the A node NODE_A. The second transistor TR2 may be controlled by a bit line discharge signal BL_DIS and may operate to selectively connect the A node NODE_A and the ground. The third transistor TR3 is controlled by a bit line bias signal BL_BIAS and may operate to selectively connect the bit line BL1 and the external power voltage terminal VEXT. Meanwhile, the internal operation circuit 200 may operate based on an internal power voltage VCORE.

The internal operation circuit 200 may be configured to perform a program operation, a read operation, or an erase operation on the memory cell connected to the bit line BL1. As necessary, the internal operation circuit 200 may be designed in various ways. Hereinafter, the internal operation circuit 200 according to an embodiment is described with reference to FIG. 7.

Figure 7:
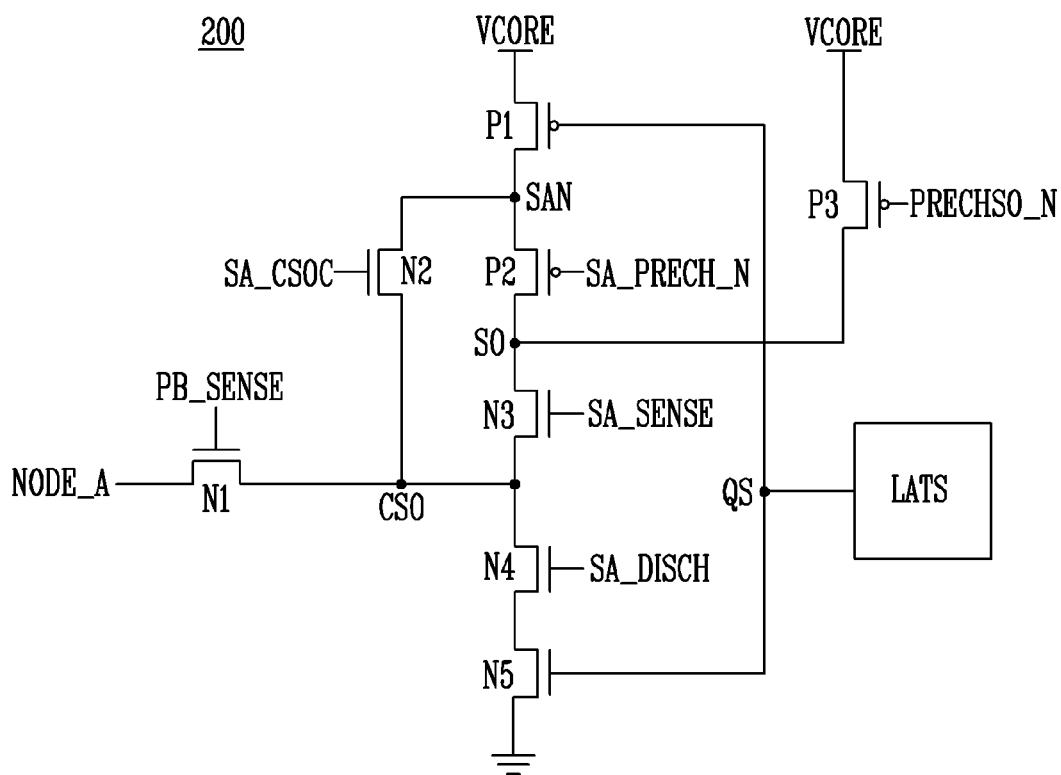
FIG. 7 is a circuit diagram illustrating an embodiment of an internal operation circuit of FIG. 6.

FIG. 7 is a circuit diagram illustrating an embodiment of the internal operation circuit 200 of FIG. 6. The internal operation circuit 200 may operate in response to a signal output from the control logic 140. Signals PB_SENSE, SA_PRECH_N, SA_SENSE, SA_CSOC, SA_DISCH, and PRECHSO_N to be described below may be control signals output from the control logic 140. The internal operation circuit 200 is specifically described as follows.

Referring to FIG. 7, the internal operation circuit 200 is connected to the A node NODE_A. The internal operation circuit 200 may perform a bit line precharge operation of charging a charge supplied from the internal power voltage VCORE through first to fifth NMOS transistors N1 to N5 and first to third PMOS transistors P1 to P3 in the bit line BL1. In addition, the internal operation circuit 200 may discharge the charge charged to the bit line BL1 through the first NMOS transistor N1, the fourth NMOS transistor N4, and the fifth NMOS transistor N5 to a ground voltage.

The first NMOS transistor N1 is connected between the A node NODE_A and a common node CSO. The first PMOS transistor P1 is connected between the internal power voltage VCORE and a sense amplifier node SAN. The second NMOS transistor N2 is connected between the common node CSO and the sense amplifier node SAN. The second PMOS transistor P2 is connected between the sense amplifier node SAN and a sensing node SO. The third NMOS transistor N3 is connected between the sensing node SO and the common node CSO. The third PMOS transistor P3 is connected between the internal power voltage VCORE and the sensing node SO. The fourth and fifth transistors N4 and N5 are connected in series between the common node CSO and the ground voltage.

The first NMOS transistor N1 is controlled by the page buffer sensing signal PB_SENSE, the second NMOS transistor N2 is controlled by the current sensing signal SA_CSOC, and the third NMOS transistor N3 is controlled by the sense amplifier sensing signal SA_SENSE. In addition, the fourth NMOS transistor N4 is controlled by the sense amplifier discharge signal SA_DISCH, and the fifth NMOS transistor N5 and the first PMOS transistor P1 are controlled by a voltage of a node QS of a sensing latch circuit LATS. The second PMOS transistor P2 is controlled by the sense amplifier precharge signal SA_PRECH_N, and the third PMOS transistor P3 is controlled by the sensing node precharge signal PRECHSO_N. That is, the page buffer sensing signal PB_SENSE is applied to a gate of the first NMOS transistor N1, the current sensing signal SA_CSOC is applied to a gate of the second NMOS transistor N2, and the sense amplifier sensing signal SA_SENSE is applied to a gate of the third NMOS transistor N3. In addition, the sense amplifier discharge signal SA_DISCH is applied to a gate of the fourth NMOS transistor N4, and the voltage of the node QS of the sensing latch circuit LATS is applied to gates of the fifth NMOS transistor N5 and the first PMOS transistor P1. The sense amplifier precharge signal SA_PRECH_N is applied to a gate of the second PMOS transistor P2, and the sensing node precharge signal PRECHSO_N is applied to a gate of the third PMOS transistor P3.

The sensing latch circuit LATS may include a latch configured with two inverters connected to the node QS, and a reset transistor and a set transistor that control the voltage of the node QS. Because the structure of sensing latch circuit LATS is widely known, a specific configuration thereof is omitted in FIG. 7.

Although the configuration of the internal operation circuit 200 is described with reference to FIG. 7, the present disclosure is not limited thereto. That is, various internal operation circuits 200 configured differently from that shown in FIG. 7 are applicable to the present disclosure.

Figure 8A:
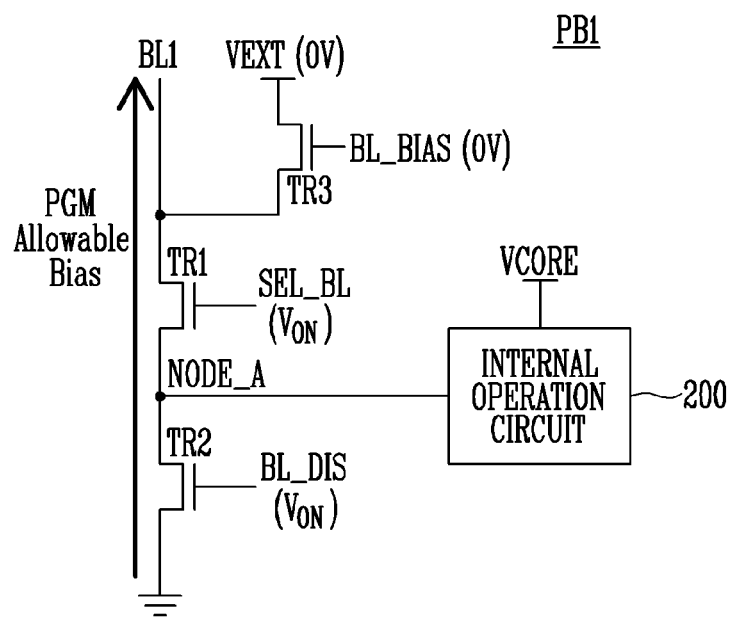
FIG. 8A is a diagram illustrating an operation of a page buffer connected to a program allowable string during a program operation of a semiconductor memory device according to an embodiment of the present disclosure.
Figure 8B:
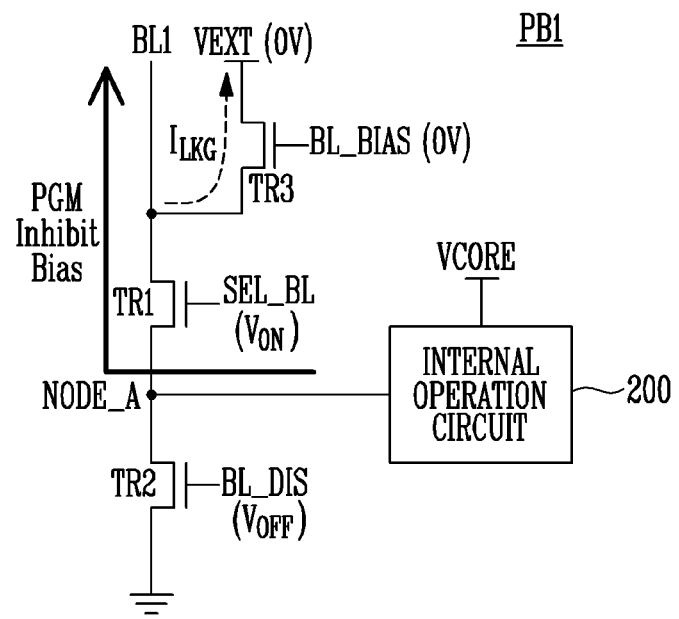
FIG. 8B is a diagram illustrating an operation of a page buffer connected to a program inhibit string during a program operation of a semiconductor memory device according to an embodiment of the present disclosure.

FIG. 8A is a diagram illustrating an operation of a page buffer connected to a program allowable string during a program operation of a semiconductor memory device according to an embodiment of the present disclosure. Meanwhile, FIG. 8B is a diagram illustrating an operation of a page buffer connected to a program inhibit string during a program operation of a semiconductor memory device according to an embodiment of the present disclosure.

During the program operation of the semiconductor memory device 100, a program allowable voltage may be applied to a bit line connected to the program allowable string, and a program inhibit voltage may be applied to a bit line connected to the program inhibit string. The program allowable string may mean a cell string including a memory cell for which a threshold voltage is set to be increased when a program voltage is applied to a word line as a memory cell in which a program is not completed among memory cells selected as a program target. The program inhibit string may mean a cell string including a memory cell for which a threshold voltage is not set to be increased when the program voltage is applied to the word line as a memory cell in which a program is completed among the memory cells selected as the program target.

The program allowable voltage may be applied to the bit line connected to the program allowable string. The program allowable voltage may be a relatively low voltage and may be, for example, a ground voltage. When the cell string connected to the first bit line BL1 is the program allowable string, the ground voltage is required to be transmitted to the first bit line BL1 as a program allowable bias. Therefore, in this case, as shown in FIG. 8A, a turn-on voltage $V_{ON}$ may be applied to the first transistor TR1 as the bit line selection signal SEL_BL. Meanwhile, the turn-on voltage $V_{ON}$ may be applied to the second transistor TR2 as the bit line discharge signal BL_DIS. As both of the first and second transistors TR1 and TR2 are turned on, the ground voltage may be transmitted to the first bit line BL1 through the first and second transistors TR1 and TR2. In this case, although not shown in FIG. 8A, the first NMOS transistor N1 of FIG. 7 may be turned off, and thus a voltage from the internal operation circuit 200 might not be transmitted to the A node NODE_A.

In this case, 0V may be applied to the external power voltage terminal VEXT, and a voltage of 0V may be applied to the third transistor TR3 as the bit line bias signal BL_BIAS. Therefore, the third transistor TR3 may be turned off.

The program inhibit voltage may be applied to the bit line connected to the program inhibit string. The program inhibit voltage may be a voltage relatively higher than the program allowable voltage. When the cell string connected to the first bit line BL1 is the program inhibit string, according to an embodiment of the present disclosure, the program inhibit voltage may be transmitted from the internal operation circuit 200 to the first bit line BL1. For example, the internal power voltage VCORE or a voltage generated therefrom is required to be transmitted to the first bit line BL1 as the program inhibit bias. Therefore, in this case, as shown in FIG. 8B, the turn-on voltage $V_{ON}$ may be applied to the first transistor TR1 as the bit line selection signal SEL_BL. Meanwhile, in order to prevent the A node NODE_A from being connected to the ground, a turn-off voltage $V_{OFF}$ may be applied to the second transistor TR2 as the bit line discharge signal BL_DIS. The internal operation circuit 200 may operate to transmit the internal power voltage VCORE or the voltage generated therefrom to the A node NODE_A as the program inhibit bias. Accordingly, the program inhibit bias may be transmitted from the internal operation circuit 200 to the first bit line BL1 through the first transistor TR1.

In this case, similar to that described with reference to FIG. 8A, 0V may be applied to the external power voltage terminal VEXT, and the voltage of 0V may be applied to the third transistor TR3 as the bit line bias signal BL_BIAS. Therefore, the third transistor TR3 may be turned off.

As shown in FIG. 8B, while the program inhibit bias is transmitted to the first bit line BL1, when the voltage of 0V is applied to the gate of the third transistor TR3 and 0V is applied to a source, that is, the external power voltage terminal VEXT, a leakage current $I_{LKG}$ may occur from a side of the first bit line BL1 to a side of the third transistor TR3. This results in that a potential of the first bit line BL1 connected to the program inhibit string may not be sufficiently increased, and thus a program disturb may occur.

Figure 9:
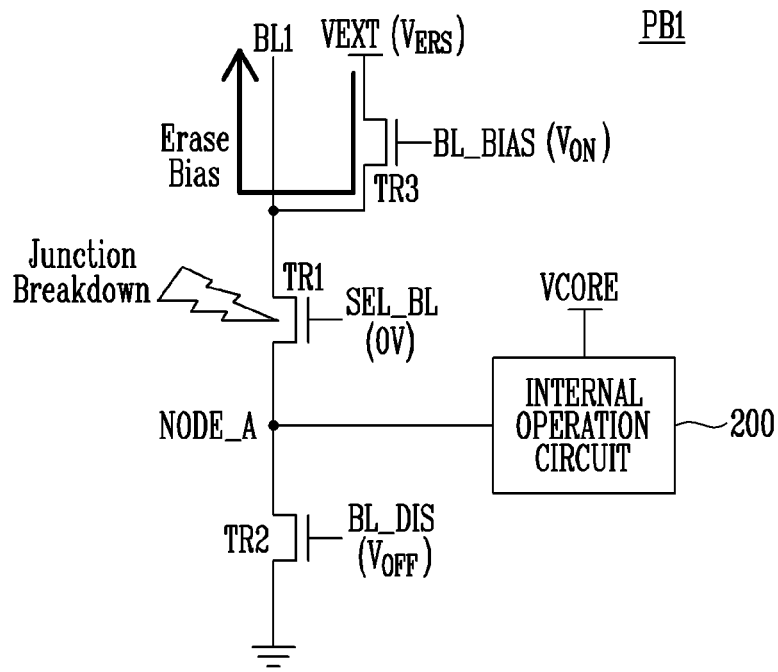
FIG. 9 is a diagram illustrating an operation of a page buffer during an erase operation of a semiconductor memory device according to an embodiment of the present disclosure.

FIG. 9 is a diagram illustrating an operation of a page buffer during an erase operation of a semiconductor memory device according to an embodiment of the present disclosure.

During the erase operation of the memory cells included in the memory block, an erase characteristic may be improved by applying an erase bias to a channel region from a bit line side simultaneously applying an erase bias to the channel region from a common source line side. In order to apply the erase bias to the channel region from the bit line BL1 side, an erase voltage $V_{ERS}$ may be received from the external power voltage terminal VEXT of the page buffer PB1. The erase voltage $V_{ERS}$ may be a relatively large voltage and may be greater than the internal power voltage VCORE. Therefore, in this case, the erase voltage $V_{ERS}$ may be received from a separate external power voltage terminal VEXT rather than the internal operation circuit 200.

More specifically, referring to FIG. 9, the erase voltage $V_{ERS}$ may be applied to the external power voltage terminal VEXT and the turn-on voltage $V_{ON}$ may be applied to the third transistor TR3 as the bit line bias signal BL_BIAS. In this case, the turn-on voltage $V_{ON}$ may be a voltage higher than the erase voltage $V_{ERS}$. For example, the turn-on voltage $V_{ON}$ applied to the third transistor TR3 may be higher than the erase voltage $V_{ERS}$ by about 2V to 4V. Therefore, the third transistor TR3 may be turned on. Accordingly, the erase voltage $V_{ERS}$ received from the external power voltage terminal VEXT may be transmitted to the first bit line BL1 through the third transistor TR3.

Meanwhile, in order to prevent connection between the first bit line BL1 and the A node NODE_A, the turn-off voltage $V_{OFF}$ may be applied to the first transistor TR1 as the bit line selection signal SEL_BL. Meanwhile, in the example of FIG. 9, the turn-off voltage $V_{OFF}$ is applied to the second transistor TR2 as the bit line discharge signal BL_DIS, but the second transistor TR2 may be turned on.

While the erase voltage $V_{ERS}$ which is a high voltage is applied to the first bit line BL1, the first transistor TR1 may be configured as a high-voltage transistor to protect the internal operation circuit 200 mainly configured of a low voltage transistor. In this case, the first transistor TR1 may function as a high-voltage protection transistor. However, when the voltage of 0V is applied to the gate of the first transistor TR1 and the erase voltage $V_{ERS}$ which is a high voltage is applied to the first bit line BL1 that is a source of the first transistor TR1, a junction breakdown may occur due to a gate induced drain leakage (GIDL) current according to a voltage state of the A node NODE_A.

When FIGS. 8B and 9 are aggregated, in a case where bit line bias conditions are a program inhibit state and an erase state, respectively, voltage conditions of the external power voltage terminal VEXT, the bit line bias signal BL_BIAS, and the bit line selection signal SEL_BL may be summarized as Table 1 below.

TABLE 1

| BL bias condition | VEXT | BL_BIAS | SEL_BL |
|---|---|---|---|
| Program Inhibit | 0 V | 0 V | $V_{ON}$ |
| Erase | $V_{ERS}$ | $V_{ERS}$ + 2 V | 0 V |

However, when the voltage condition shown in Table 1 is applied, as described above, in the program inhibit operation, the leakage current $I_{LKG}$ may occur from the first bit line BL1 side to the third transistor TR3 side, and in the erase operation, the junction breakdown may occur due to the GIDL current in the first transistor TR1.

According to a semiconductor memory device and a method of operating the same according to another embodiment of the present disclosure, when the bit line bias conditions are the erase and program inhibit states, respectively, the voltage conditions of the external power voltage terminal VEXT, the bit line bias signal BL_BIAS, and the bit line selection signal SEL_BL may be summarized as Table 2 below.

TABLE 2

| BL bias condition | VEXT | BL_BIAS | SEL_BL |
|---|---|---|---|
| Program Inhibit | Va | 0 V | $V_{ON}$ |
| Erase | $V_{ERS}$ | $V_{ERS}$ + 2 V | Vb |

In Table 2 above, a first voltage Va is a voltage greater than 0V, and a second voltage Vb is also a voltage greater than 0V. When the voltage condition shown in Table 2 is applied, in the program inhibit operation, the leakage current $I_{LKG}$ from the first bit line BL1 side to the third transistor TR3 side may be suppressed, and in the erase operation, occurrence of the junction breakdown due to the GIDL current in the first transistor TR1 may be prevented. Hereinafter, the disclosure is described in more detail with reference to FIGS. 10 and 11.

Figure 10:
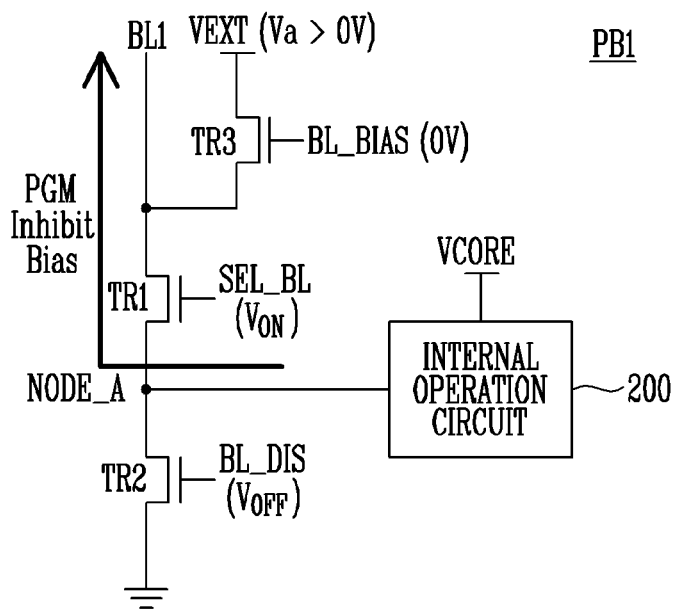
FIG. 10 is a diagram illustrating an operation of a page buffer connected to a program inhibit string during a program operation of a semiconductor memory device according to another embodiment of the present disclosure.

FIG. 10 is a diagram illustrating an operation of a page buffer connected to a program inhibit string during a program operation of a semiconductor memory device according to another embodiment of the present disclosure.

Referring to FIG. 10, the program inhibit voltage may be applied to the bit line connected to the program inhibit string. The program inhibit voltage may be a voltage relatively higher than the program allowable voltage. When the cell string connected to the first bit line BL1 is the program inhibit string, the program inhibit voltage may be transmitted from the internal operation circuit 200 to the first bit line BL1. For example, the internal power voltage VCORE or a voltage generated therefrom is required to be transmitted to the first bit line BL1 as the program inhibit bias. Therefore, in this case, as shown in FIG. 10, the turn-on voltage $V_{ON}$ may be applied to the first transistor TR1 as the bit line selection signal SEL_BL. Meanwhile, in order to prevent the A node NODE_A from being connected to the ground, the turn-off voltage $V_{OFF}$ may be applied to the second transistor TR2 as the bit line discharge signal BL_DIS. The internal operation circuit 200 may operate to transmit the internal power voltage VCORE or the voltage generated therefrom to the A node NODE_A as the program inhibit bias. Accordingly, the program inhibit bias may be transmitted from the internal operation circuit 200 to the first bit line BL1 through the first transistor TR1.

Differently from that described with reference to FIG. 8B, according to the embodiment shown in FIG. 10, the first voltage Va greater than 0V may be applied to the external power voltage terminal VEXT, and the voltage of 0V may be applied to the third transistor TR3 as the bit line bias signal BL_BIAS. Accordingly, the third transistor TR3 may be turned off.

According to that shown in FIG. 10, while the program inhibit bias is transmitted to the first bit line BL1, the voltage of 0V is applied to the gate of the third transistor TR3, and the voltage of the first voltage Va greater than 0V is applied to the source, that is, the external power voltage terminal VEXT. The first voltage Va may be variously determined. For example, the first voltage Va may be a low voltage between 0.5V and 1V. In this case, occurrence of the leakage current $I_{LKG}$ from the first bit line BL1 side to the third transistor TR3 side may be prevented. Therefore, the potential of the first bit line BL1 connected to the program inhibit string may be sufficiently increased without the occurrence of the leakage current, and as a result, program disturbance may be prevented.

Figure 11:
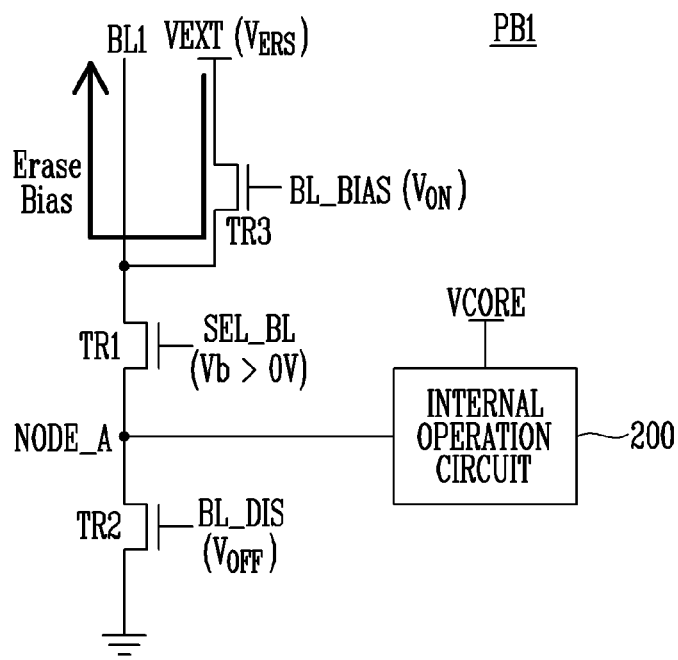
FIG. 11 is a diagram illustrating an operation of a page buffer during an erase operation of a semiconductor memory device according to another embodiment of the present disclosure.

FIG. 11 is a diagram illustrating an operation of a page buffer, shown as the page buffer PB1, during an erase operation of a semiconductor memory device according to another embodiment of the present disclosure.

Referring to FIG. 11, the erase voltage $V_{ERS}$ may be applied to the external power voltage terminal VEXT and the turn-on voltage $V_{ON}$ may be applied to the third transistor TR3 as the bit line bias signal BL_BIAS. In this case, the turn-on voltage $V_{ON}$ may be a voltage higher than the erase voltage $V_{ERS}$. For example, the turn-on voltage $V_{ON}$ applied to the third transistor TR3 may be higher than the erase voltage $V_{ERS}$ by about 2V to 4V. Therefore, the third transistor TR3 may be turned on. Accordingly, the erase voltage $V_{ERS}$ received from the external power voltage terminal VEXT may be transmitted to the first bit line BL1 through the third transistor TR3.

Meanwhile, in the embodiment of FIG. 11, the second voltage Vb greater than 0V may be applied to the first transistor TR1 as the bit line selection signal SEL_BL. In addition, the turn-off voltage $V_{OFF}$ is applied to the second transistor TR2 as the bit line discharge signal BL_DIS to disconnect between the A node NODE_A and the ground.

The second voltage Vb may be greater than 0V but less than the turn-on voltage $V_{ON}$. For example, the second voltage Vb may be a low voltage between 1V and 2V. In this case, a breakdown voltage increases in a junction overlap region compared to the case of the embodiment of FIG. 9 in which the voltage of 0V is applied to the gate of the first transistor TR1. That is, a possibility of the junction breakdown may be reduced.

However, as the second voltage Vb is applied to the gate of the first transistor TR1, the first transistor TR1 may be weakly turned on. This means that the A node NODE_A and the first bit line BL1 may be connected. However, because the second transistor TR2 is turned off, the connection between the A node NODE_A and the ground is cut off. In addition, when a transistor connected to the A node NODE_A in the internal operation circuit 200, for example, the first NMOS transistor N1 of FIG. 7 is turned off, the connection between the A node NODE_A and the internal operation circuit 200 is also cut off. Through this, the same effect as a complete turn-off of the first transistor TR1 may be obtained.

Figure 12:
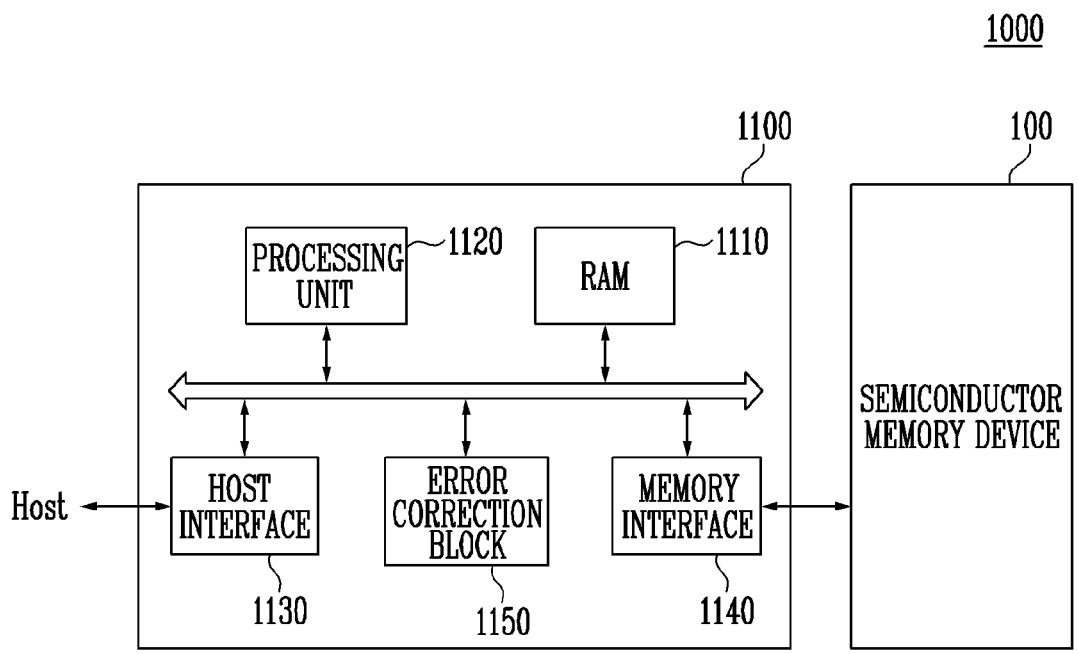
FIG. 12 is a block diagram illustrating a memory system including the semiconductor memory device of FIG. 1.

FIG. 12 is a block diagram illustrating a memory system 1000 including the semiconductor memory device 100 of FIG. 1.

Referring to FIG. 12, the memory system 1000 includes the semiconductor memory device 100 and a memory controller 1100. The semiconductor memory device 100 may be the semiconductor memory device described with reference to FIG. 1. Hereinafter, a repetitive description is omitted.

The memory controller 1100 is connected to a host Host and the semiconductor memory device 100. The memory controller 1100 is configured to access the semiconductor memory device 100 in response to a request from the host Host. For example, the memory controller 1100 is configured to control read, write, erase, and background operations of the semiconductor memory device 100. The memory controller 1100 is configured to provide an interface between the semiconductor memory device 100 and the host Host. The memory controller 1100 is configured to drive firmware for controlling the semiconductor memory device 100.

The memory controller 1100 includes random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls an overall operation of the memory controller 1100. In addition, the memory controller 1100 may temporarily store program data provided by the host Host during the write operation.

The host interface 1130 includes a protocol for performing data exchanges between the host Host and the memory controller 1100. As an embodiment, the memory controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 includes a NAND interface or a NOR interface.

The error correction block 1150 is configured to detect and correct an error of data received from the semiconductor memory device 100 using an error correcting code (ECC). As an embodiment, the error correction block may be provided as a component of the memory controller 1100.

The memory controller 1100 and the semiconductor memory device 100 may be integrated into one semiconductor device. As an embodiment, the memory controller 1100 and the semiconductor memory device 100 may be integrated into one semiconductor device to form a memory card. For example, the memory controller 1100 and the semiconductor memory device 100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The memory controller 1100 and the semiconductor memory device 100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operation speed of the host connected to the memory system 1000 is dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an embodiment, the semiconductor memory device 100 or the memory system 1000 may be mounted as a package of various types. For example, the semiconductor memory device 100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit package (SOIC), a shrink small outline package (SSOP), a thin small outline package (TSOP), a system in package (SIP), a multi-chip package (MCP), a wafer-level fabricated package (WFP), or a wafer-level processed stack package (WSP).

Figure 13:
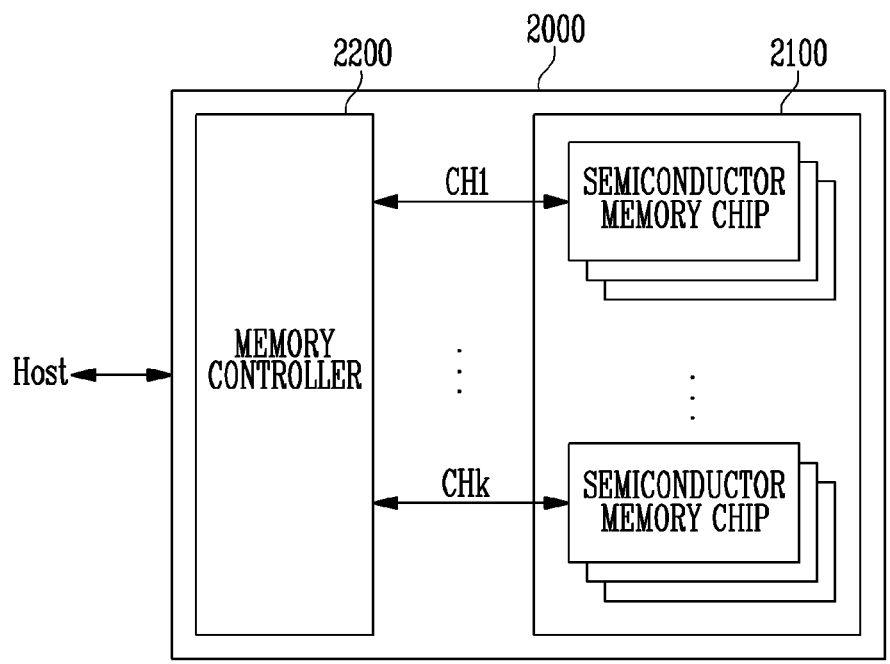
FIG. 13 is a block diagram illustrating an application example of the memory system of FIG. 12.

FIG. 13 is a block diagram illustrating an application example of the memory system of FIG. 12.

Referring to FIG. 13, a memory system 2000 includes a semiconductor memory device 2100 and a memory controller 2200. The semiconductor memory device 2100 includes a plurality of semiconductor memory chips. The plurality of semiconductor memory chips are divided into a plurality of groups.

In FIG. 13, the plurality of groups communicate with the memory controller 2200 through first to k-th channels CH1 to CHk, respectively. Each semiconductor memory chip is configured and is operated similarly to that of the semiconductor memory device 100 described with reference to FIG. 1.

Each group is configured to communicate with the memory controller 2200 through one common channel. The memory controller 2200 is configured similarly to the memory controller 1100 described with reference to FIG. 12 and is configured to control the plurality of memory chips of the semiconductor memory device 2100 through the plurality of channels CH1 to CHk.

Figure 14:
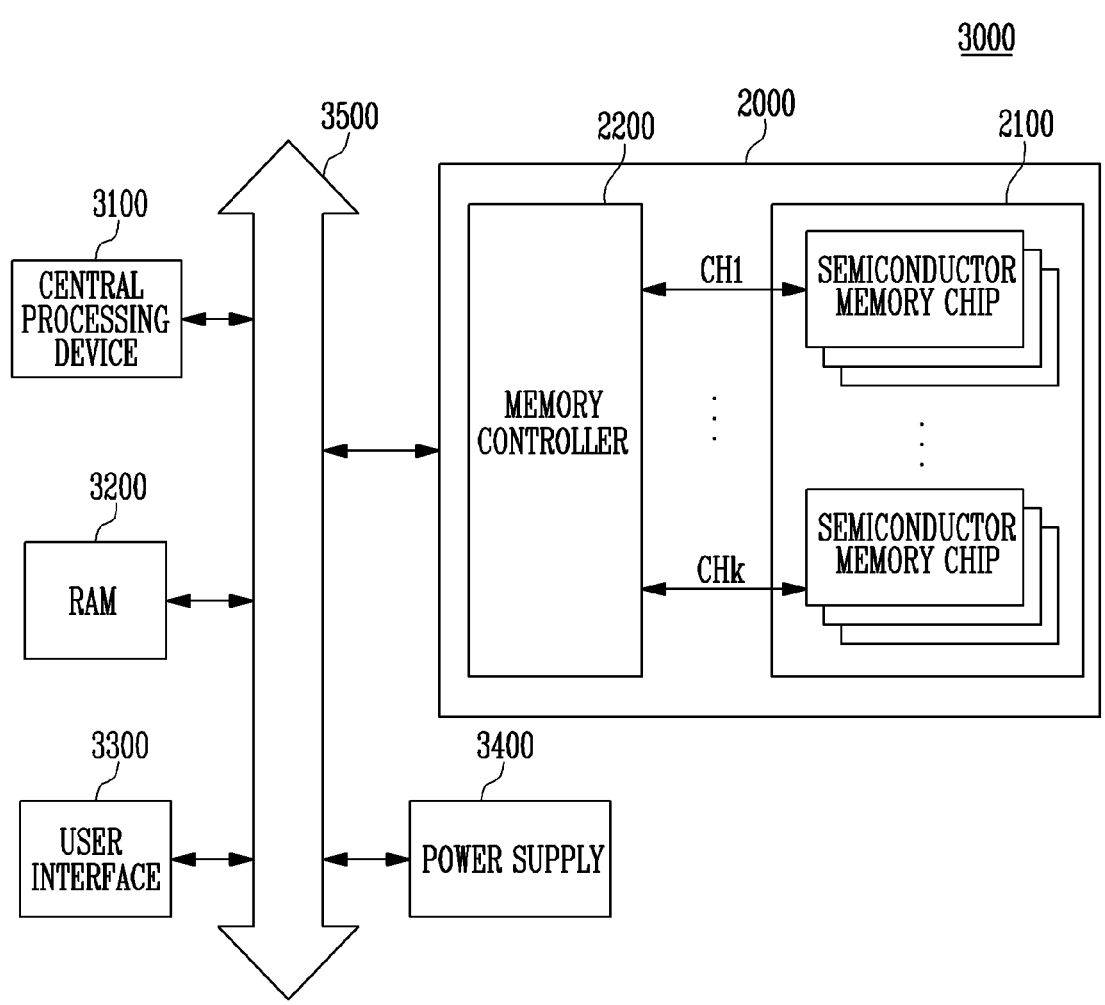
FIG. 14 is a block diagram illustrating a computing system including the memory system described with reference to FIG. 13.

FIG. 14 is a block diagram illustrating a computing system 3000 including the memory system described with reference to FIG. 13.

The computing system 3000 includes a central processing device 3100, random access memory (RAM) 3200, a user interface 3300, a power supply 3400, a system bus 3500, and the memory system 2000.

The memory system 2000 is electrically connected to the central processing device 3100, the RAM 3200, the user interface 3300, and the power supply 3400 through the system bus 3500. Data provided through the user interface 3300 or processed by the central processing device 3100 is stored in the memory system 2000.

In FIG. 14, the semiconductor memory device 2100 is connected to the system bus 3500 through the memory controller 2200. However, the semiconductor memory device 2100 may be configured to be directly connected to the system bus 3500. At this time, a function of the memory controller 2200 is performed by the central processing device 3100 and the RAM 3200.

In FIG. 14, the memory system 2000 described with reference to FIG. 13 is provided. However, the memory system 2000 may be replaced with the memory system 1000 described with reference to FIG. 12. As an embodiment, the computing system 3000 may be configured to include both of the memory systems 1000 and 2000 described with reference to FIGS. 12 and 13.

What is claimed is:

1. A semiconductor memory device comprising:
a memory cell array including a plurality of memory cells for storing data;
a page buffer coupled to at least one memory cell among the plurality of memory cells through a bit line and configured to store data in the at least one memory cell; and
control logic configured to control an operation of the page buffer,
wherein the page buffer comprises:
a first transistor coupled between the bit line and a first node;
a second transistor coupled between the bit line and an external power voltage terminal; and
an internal operation circuit coupled to the first node, wherein the control logic is configured to:
control, when a program inhibit bias is transmitted to the bit line, the page buffer to transmit the program inhibit bias from the internal operation circuit to the bit line by turning on the first transistor and disconnect between the external power voltage terminal and the bit line by turning off the second transistor; and
apply, to suppress occurrence of a leakage current from a side of the bit line to a side of the second transistor, a first voltage greater than 0V to the external power voltage terminal while the program inhibit bias is transmitted to the bit line during a program operation.

2. The semiconductor memory device of claim 1, wherein:
the page buffer further comprises a third transistor coupled between the first node and ground; and
the control logic is configured to control the page buffer to disconnect between the first node and the ground by turning off the third transistor while the program inhibit bias is transmitted to the bit line.

3. The semiconductor memory device of claim 1, wherein the internal operation circuit is configured to:
receive a power voltage from an internal power voltage terminal; and
output a second voltage supplied by the internal power voltage terminal to the first node as the program inhibit bias.

4. The semiconductor memory device of claim 1, wherein the internal operation circuit is configured to:
receive a power voltage from an internal power voltage terminal; and
output a third voltage generated based on a second voltage supplied from the internal power voltage terminal to the first node as the program inhibit bias.

5. The semiconductor memory device of claim 1, wherein the first voltage is between 0.5 volt and 1 volt.

6. The semiconductor memory device of claim 1, wherein the first transistor is a high-voltage protection transistor.

7. The semiconductor memory device of claim 1, wherein the internal operation circuit comprises:
a fourth transistor coupled between the first node and a second node;
a fifth transistor coupled between an internal power voltage terminal and a third node;
a sixth transistor coupled between the second node and the third node;
a seventh transistor coupled between the third node and a fourth node; and
an eighth transistor coupled between the second node and the fourth node.

8. A semiconductor memory device comprising:
a memory cell array including a plurality of memory cells for storing data;
a page buffer coupled to at least one memory cell among the plurality of memory cells through a bit line and configured to erase data stored in the at least one memory cell; and
control logic configured to control an operation of the page buffer,
wherein the page buffer comprises:
a first transistor coupled between the bit line and a first node;

a second transistor coupled between the first node and a ground;

a third transistor coupled between the bit line and an external power voltage terminal; and an internal operation circuit coupled to the first node, wherein the control logic is configured to:

apply, when an erase bias is applied to the bit line, an erase voltage to the external power voltage terminal;

control the page buffer to connect the external power voltage terminal and the bit line by turning on the third transistor; and apply, to increase a breakdown voltage in a junction overlap region of the first transistor, a first voltage greater than 0V and less than a turn-on voltage to a gate of the first transistor while the erase voltage is applied to the bit line through the external power voltage terminal during an erase operation.

9. The semiconductor memory device of claim 8, wherein the control logic is configured to control the page buffer to apply the turn-on voltage greater than the erase voltage to a gate of the third transistor.

10. The semiconductor memory device of claim 8, wherein the first voltage is between 1 volt and 2 volts.

11. The semiconductor memory device of claim 8, wherein the first transistor is a high-voltage protection transistor.

12. The semiconductor memory device of claim 8, wherein the control logic is configured to, while the erase bias is transmitted to the bit line, control the page buffer to disconnect between the first node and the ground by turning off the second transistor.

13. The semiconductor memory device of claim 8, wherein the internal operation circuit comprises:

a fourth transistor coupled between the first node and a second node;

a fifth transistor coupled between an internal power voltage terminal and a third node;

a sixth transistor coupled between the second node and the third node;

a seventh transistor coupled between the third node and a fourth node; and an eighth transistor coupled between the second node and the fourth node.

14. The semiconductor memory device of claim 13, wherein the control logic is configured to control the page buffer to disconnect between the first node and the second node by turning off the fourth transistor while the erase bias is transmitted to the bit line.

* * * * *